(12) United States Patent
Doron

(10) Patent No.: US 6,778,599 B1
(45) Date of Patent: Aug. 17, 2004

(54) DIGITAL TRANSCEIVER WITH MULTI-RATE PROCESSING

(75) Inventor: Ayelet Shahar Doron, Modi'in (IL)

(73) Assignee: Tioga Technologies, San Jose, CA (US)

(*) Notice: Subject to any disclaimer, the term of this patent is extended or adjusted under 35 U.S.C. 154(b) by 0 days.

(21) Appl. No.: 09/521,337

(22) Filed: Mar. 9, 2000

(51) Int. Cl.$^7$ ................................................. H03H 7/30
(52) U.S. Cl. ........................ 375/232; 375/219; 370/286; 379/406.8
(58) Field of Search ................................ 375/219, 229, 375/230, 231, 232, 233; 379/406.8; 370/286, 290

(56) References Cited

U.S. PATENT DOCUMENTS

| | | | |
|---|---|---|---|
| 3,665,171 A | * 5/1972 | Morrow | 375/233 |
| 5,420,884 A | * 5/1995 | Inoue | 375/229 |
| 5,550,596 A | 8/1996 | Strolle et al. | |
| 5,604,769 A | 2/1997 | Wang | |
| 6,240,128 B1 | 5/2001 | Banerjea et al. | |
| 6,404,810 B1 | * 6/2002 | Girardeau et al. | 375/232 |
| 6,430,287 B1 | * 8/2002 | Rao | 379/406.08 |

OTHER PUBLICATIONS

Vaidyanathan, in "Multirate Systems and Filter Banks", Prentice Hall, 1993.
Gitlin, et al., "Data Communications Principles", Plenum Press, 1992.
Haykin, in "Adaptive Filter Theory", 3$^{rd}$ edition, Prentice Hall, 1996.

* cited by examiner

Primary Examiner—Temesghen Ghebretinsae
(74) Attorney, Agent, or Firm—Darby & Darby

(57) ABSTRACT

A digital data receiver includes a front end, coupled to receive an input signal transmitted over a communication channel, the signal representing a stream of transmitted symbols with a given input symbol rate, and to generate, responsive to the input signal, a stream of received samples at a processing rate that is a non-integer rational multiple of the input symbol rate. A feed-forward equalizer receives input samples at the processing rate, responsive to the received samples, and generates forward-equalized samples at the input symbol rate. Decision circuitry processes the forward-equalized samples so as to generate a stream of estimated symbols at the input symbol rate.

38 Claims, 6 Drawing Sheets

DIGITAL TRANSCEIVER WITH MULTI-RATE PROCESSING

FIELD OF THE INVENTION

The present invention relates generally to data communication devices, and specifically to adaptive digital data transceivers.

BACKGROUND OF THE INVENTION

FIG. 1 is a block diagram that schematically illustrates a generalized multi-rate filter 10, having an output sample rate that is an arbitrary rational fraction, L/M, of the input sample rate. This scheme is described by Vaidyanathan in *Multirate Systems and Filter Banks* (Prentice Hall, 1993), which is incorporated herein by reference, pages 100–133. An input signal x(n) is first upsampled by an integer factor L, typically using an interpolator 12. The upsampled signal is filtered by a digital filter block 14 with response H(z). A decimator 16 downsamples the filtered signal by another integer factor M. L may be either greater than or less than M. The output signal y(n) from filter 10 has a sample rate L/M times the sample rate of the input signal x(n).

The use of fractionally-spaced digital equalizers and echo cancellers is also known in the art. Such devices, which process signals at a rate that is higher than the symbol rate, have been found to give improved performance over synchronous devices. The taps of a fractionally-spaced time-domain equalizer, for example, are separated in time by less than the interval between the symbols. Typically, the tap interval is an integer dividend of the symbol interval, so that the equalizer operates at a rate that is an integer multiple of the symbol rate. A comprehensive discussion of such devices is presented, for example, by Gitlin et al., in *Data Communications Principles* (Plenum Press, 1992), which is incorporated herein by reference. (See particularly pages 488–499 and 528–535 regarding equalizers, and pages 607–661 regarding echo cancellation.)

SUMMARY OF THE INVENTION

It is an object of some aspects of the present invention to provide improved devices and methods for multi-rate signal processing.

In preferred embodiments of the present invention, a digital data transceiver comprises a transmitter and a receiver, which respectively transmit an output signal and receive an input signal, representing sequences of data symbols with a predetermined symbol rate. The input signal is sampled by an analog front end of the receiver at a processing rate that is a non-integer rational multiple of the predetermined symbol rate, preferably a non-integer multiple less than two. An echo canceller generates, responsive to symbols transmitted by the transmitter, an echo estimation signal at the processing rate, for subtraction from the sampled input signal. Following echo cancellation, a feed-forward equalizer receives the signal at the processing rate and generates a forward-equalized signal, while at the same time downsampling the signal back to the original symbol rate. The forward-equalized symbols are processed by decision circuitry, preferably including a slicer and decision feedback equalizer, as is known in the art, to output a stream of estimated data symbols.

By comparison with multi-rate transceivers known in the art, the architecture of the present transceiver is unique in that both the echo canceller and the feed-forward equalizer operate at the same, non-integer multiple rate. The transceiver thus achieves the performance benefit of fractionally-spaced processing, with a reduced number of computations per symbol interval relative to that required for implementation of double-rate processing, as is commonly used in transceivers known in the art.

In some preferred embodiments of the present invention, the echo canceller and equalizer comprise multi-phase (or multi-section) filters, with a plurality of taps. For each of the taps, the filter stores a number of groups of filter coefficients, such that each group contains one filter coefficient for each of the plurality of taps. The samples in the taps are multiplied by the filter coefficients in each of the groups in turn so as to generate tap outputs, which are summed to give a partial sum for that group. The filter coefficients in each group are computed so as to combine the desired filtering effect (such as echo cancellation or equalization) with interpolation between the samples. Therefore, multiplying the samples by the coefficients in the different groups with the appropriate timing effectively upsamples the filter input by a factor equal to the number of groups.

A switch selects among the partial sums for the different groups at a downsampling rate that is an integer dividend of the product of the input sample rate times the number of groups. In other words, the multiple groups of filter coefficients effectively upsample the input by a first integer factor equal to the number of groups, and the switch then decimates the partial sums by a second integer factor. The output sample rate of the filter is thus a rational, non-integer multiple of the input sample rate given by the quotient of the first and second integer factors. Substantially any choice of integer factors may be used, although practically 3:2 has been found to give advantageous results with minimal hardware complication. Those skilled in the art will appreciate that multi-rate filters of this type are useful not only in the context of the transceiver described hereinabove, but also in other digital filtering applications.

Preferably, the echo canceller and equalizer comprise adaptive filters, which receive respective error signals responsive to the filter outputs. The multiple groups of coefficients are automatically adjusted responsive to the respective error signals. Preferably, a least-mean-square (LMS) algorithm is used to determine optimal coefficients in all of the groups and then to adjust the coefficients as necessary during operation of the transceiver. Most preferably, in an initial phase of operation of the filter, different starting conditions are applied to the different groups in order to ensure that the coefficients in the different groups have different values, reflecting their role in interpolating between the samples, and thus preventing their erroneously converging to the same values. In a preferred embodiment, the starting conditions are imposed on the equalizer by transmitting a known training sequence of symbols to the receiver.

There is therefore provided, in accordance with a preferred embodiment of the present invention, a digital data receiver, including:

a front end, coupled to receive an input signal transmitted over a communication channel, the signal representing a stream of transmitted symbols with a given input symbol rate, and to generate, responsive to the input signal, a stream of received samples at a processing rate that is a non-integer rational multiple of the input symbol rate;

a feed-forward equalizer, coupled to receive input samples at the processing rate, responsive to the received samples, and to generate forward-equalized samples at the input symbol rate, the feed-forward equalizer including:

a first plurality of taps, arranged in series to receive a succession of the input samples at the processing rate;

a second plurality of registers operative to store filter coefficients in a number of groups, such that each group contains one filter coefficient for each of the first plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group equalized partial sums; and at least one switch, operative to select among the groups at the input symbol rate, so that the equalized partial sums are output in alternation as the forward-equalized samples; and decision circuitry, coupled to process the forward-equalized samples so as to generate a stream of estimated symbols at the input symbol rate.

In a preferred embodiment, the input signal includes a Digital Subscriber Line (DSL) signal, and the processing rate is substantially equal to 1.5 times the input symbol rate.

Preferably, the feed-forward equalizer includes an adaptive filter, and wherein the filter coefficients are adjusted automatically responsive to an error signal based on the stream of estimated symbols. In a preferred embodiment, the receiver includes a training switch, coupled to substitute a sequence of known training symbols for the estimated symbols during an initial adjustment of the filter coefficients of the equalizer.

Preferably, the receiver is coupled to a transmitter, which is adapted to transmit an output signal over the channel based on a stream of output symbols, and includes:

an echo canceller, coupled to generate, responsive to the output symbols, echo cancellation values at the processing rate; and an adder, coupled to sum the received samples with the echo cancellation values, thus generating the input samples to the feed-forward equalizer at the processing rate.

There is also provided, in accordance with a preferred embodiment of the present invention, a digital data transceiver, including:

a transmitter, which is adapted to transmit an output signal over a communication channel based on a stream of output symbols at an output symbol rate;

an echo canceller, coupled to generate, responsive to the output symbols, echo cancellation values at a predetermined processing rate; and a receiver, which includes:

a front end, coupled to receive an input signal over the communication channel, the signal representing a stream of transmitted symbols with a given input symbol rate, and to generate, responsive thereto, a stream of input samples at the processing rate;

an adder, coupled to sum the input samples with the echo cancellation values, thus generating echo-canceled samples at the processing rate;

an equalizer, coupled to filter the echo-canceled samples so as to generate equalized samples at the input symbol rate; and decision circuitry, coupled to process the equalized samples so as to generate a stream of estimated symbols at the input symbol rate, wherein the processing rate is a non-integer rational multiple of at least one of the input symbol rate and the output symbol rate.

Preferably, the output symbol rate is substantially equal to the input symbol rate. Alternatively or additionally, the output symbol rate is different from the input symbol rate.

There is also provided, in accordance with a preferred embodiment of the present invention, a method for processing an input signal received over a communication channel, in the presence of an echo signal based on a stream of output symbols provided at an output symbol rate, the input signal representing a stream of transmitted symbols with a given input symbol rate, the method including:

determining echo cancellation values at a predetermined processing rate, responsive to the stream of output symbols;

sampling the input signal to generate a stream of received samples at the processing rate;

summing the received samples with the echo cancellation values, thus generating echo-canceled samples at the processing rate;

equalizing the echo-canceled samples so as to generate a stream of forward-equalized samples at the input symbol rate; and applying a decision process to the forward-equalized samples so as to generate a stream of estimated symbols at the input symbol rate, wherein the processing rate is a non-integer rational multiple of at least one of the input symbol rate and the output symbol rate.

Preferably, processing the received samples includes equalizing the received samples adaptively, using filter coefficients that are adjusted automatically responsive to an error signal derived from the estimated symbols. In a preferred embodiment, equalizing the received samples adaptively includes:

providing at least first and second groups of filter coefficients for use in equalizing the received samples;

initially determining values of the filter coefficients in the first group; and subsequently determining values of the filter coefficients in the second group responsive to the values determined in the first group.

There is further provided, in accordance with a preferred embodiment of the present invention, an adaptive digital filter for processing an input signal having an input sample rate, including:

a first plurality of taps, arranged in series to receive a succession of samples of the input signal at the input sample rate;

a second plurality of registers operative to store a number of groups of filter coefficients, which are automatically adjustable during operation of the filter, such that each group contains one filter coefficient for each of the plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group partial sums; and at least one switch, operative to select among the groups at a selection rate that is substantially equal to the product of the input sample rate times the number of groups divided by a selected integer, so as to generate an output signal including a sequence of the partial sums having an output sample rate that is a non-integer rational fraction of the input sample rate; and an error signal input line, coupled to provide to the filter an error signal derived from the output signal for use in automatic adjustment of the filter coefficients.

Preferably, the one or more summers include a respective summer for each of the groups, and the at least one switch is operative to select among the respective group partial sums.

Alternatively or additionally, the third plurality of multipliers includes a number of multipliers for each of the taps that is equal to the number of groups, such that one of the multipliers is assigned respectively to generate each of the tap outputs, wherein the multipliers operate at a rate that is substantially equal to the input sample rate divided by the selected integer.

Alternatively, the one or more summers include a single summer, wherein the at least one switch includes a respective switch for each of the first plurality of taps, which switch is coupled to select the filter coefficient by which to multiply the sample in the tap.

In a preferred embodiment, the number of groups is chosen to be one of the values two and three, and the selected integer is equal to the other of the values.

Preferably, each filter coefficient is automatically adjusted at an adjustment rate that is substantially equal to the input sample rate divided by the selected integer.

Further preferably, the filter coefficients are automatically adjusted using a least-mean-square method.

In a preferred embodiment, the filter includes an echo cancellation filter, and the output signal includes echo estimation values, and the error signal provides an estimate of a residual echo remaining following subtraction of the echo estimation values from a received signal.

In another preferred embodiment, the filter includes a feed-forward equalizer, and the output signal includes equalized signal values, and wherein the error signal is responsive to a difference between the equalized signal values and estimated symbols derived from the equalized signal values.

There is moreover provided, in accordance with a preferred embodiment of the present invention, a method for adaptive digital filtering of an input signal having an input sample rate, including:

receiving a plurality of successive samples of the input signal at the input sample rate;

automatically computing a number of groups of filter coefficients responsive to an error signal, each group containing one filter coefficient for each of the plurality of samples;

multiplying the samples by the corresponding filter coefficients so as to generate for each of the samples respective sample outputs for all of the groups;

summing the sample outputs belonging to each one of the groups, thus generating respective group partial sums for all of the groups;

selecting among the groups at a selection rate that is substantially equal to the product of the input sample rate times the number of groups divided by a selected integer, so as to generate an output signal including a sequence of the partial sums having an output sample rate that is a non-integer rational fraction of the input sample rate; and deriving the error signal from the output signal.

The present invention will be more fully understood from the following detailed description of the preferred embodiments thereof, taken together with the drawings in which:

DETAILED DESCRIPTION OF PREFERRED EMBODIMENTS

Figure 1:
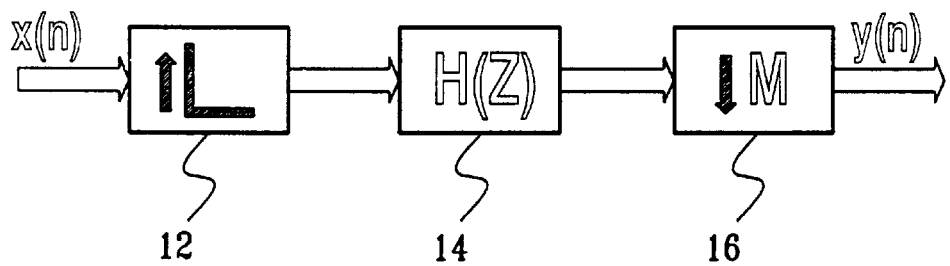
FIG. 1 is a block diagram that schematically illustrates a generalized multi-rate filter, as is known in the art.
Figure 2:
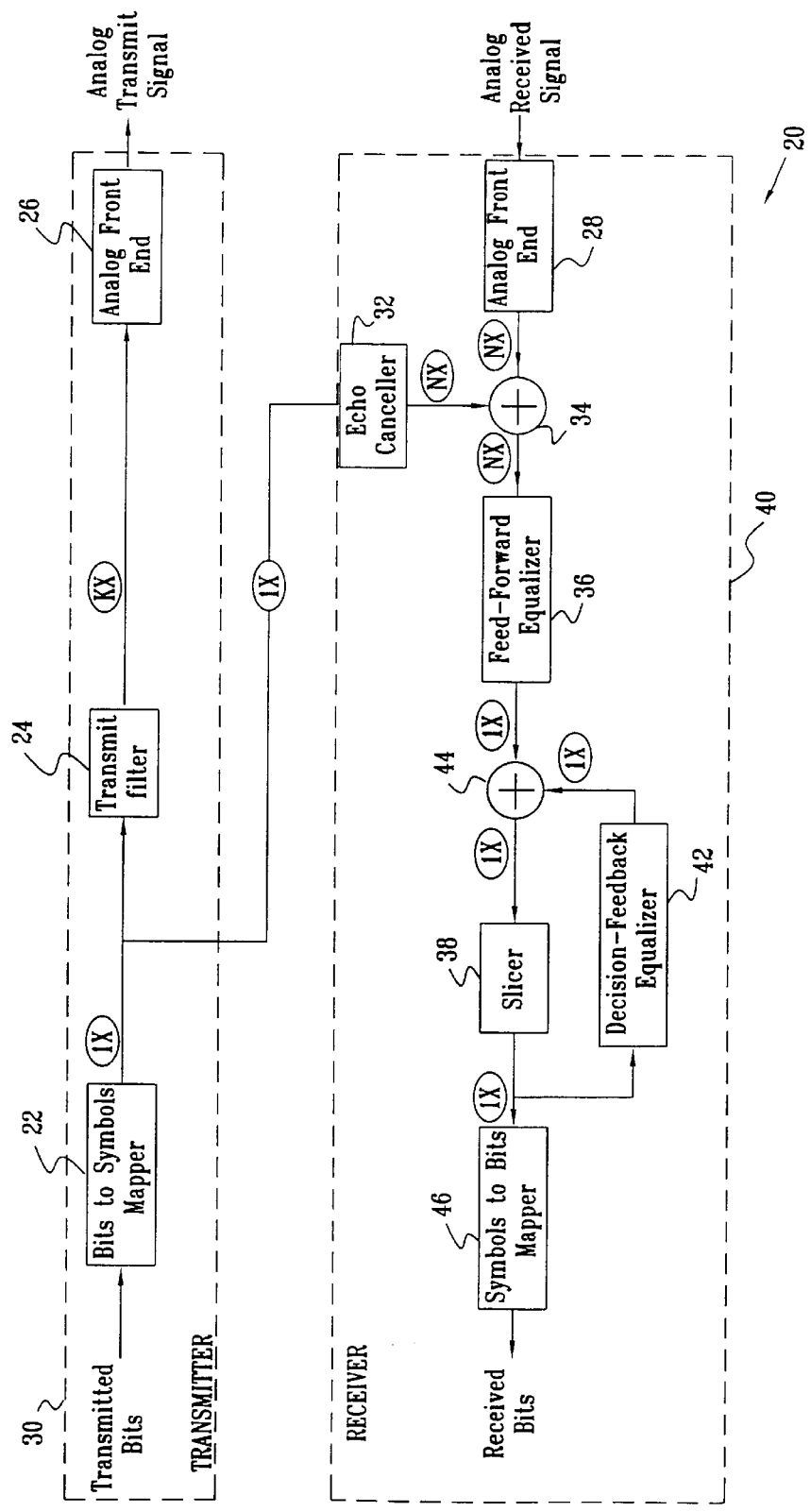
FIG. 2 is a block diagram that schematically illustrates a digital data transceiver, in accordance with a preferred embodiment of the present invention.

FIG. 2 is a block diagram that schematically illustrates a high-speed digital data transceiver 20, in accordance with a preferred embodiment of the present invention. Transceiver 20 is designed to meet the needs of Digital Subscriber Line (DSL) communications, and particularly to serve as a modem in a Symmetrical DSL (SDSL) system. Applications of the architecture and operational principles of this transceiver in other areas of data transmission, however, will be apparent to those skilled in the art.

Transceiver 20 comprises a transmitter 30 and a receiver 40. The transmitter receives a stream of bits to be transmitted and converts the bitstream to appropriate symbols in a bit-to-symbol mapper 22. The mapper outputs symbols at a basic symbol rate marked as "1X" in the figure. A transmit filter 24 upsamples and interpolates the symbols to generate an output signal at a rate KX, while shaping the signal to a predefined spectral profile, or mask. The upsampled signal is transmitted into an analog channel by an analog front end 26. Transmitter 30 is not substantively different from data transmitters known in the art.

Receiver 40 receives an analog signal in an analog front end 28, which generates an input digital sample stream at a sample rate NX. Here N is a predetermined non-integer rational factor, preferably between 1 and 2, most preferably 1.5. An echo canceller 32, whose operation is described in detail hereinbelow, receives output symbols generated by mapper 22 and generates echo estimation values at the same rate NX as the input sample stream from front end 28. An adder 34, operating at rate NX, subtracts the echo estimation values from the input samples and provides an echo-canceled input to a feed-forward equalizer 36. The equalizer, also described in detail hereinbelow, simultaneously filters the samples at rate NX and downsamples them to the basic 1X rate. A slicer 38 and decision feedback equalizer 42, together with an adder 44, process the filtered samples output by feed-forward equalizer 36 to generate an estimated input symbol stream, as is known in the art. A symbol-to-bit mapper 46 then converts the symbols into a received bitstream.

Alternatively, although in FIG. 2 the transmitter and receiver are shown to share the same basic "1X" symbol rate, the basic symbol rate of the receiver may be different from that of the transmitter, i.e. the symbol rates at the different communication directions are asymmetric. For example, if the output symbol rate of the transmitter is 1.5 times the input symbol rate of the receiver, then the processing can be performed at 1.5 times the input symbol rate. In this case the echo canceller does not perform any rate conversion, while the equalizer decimates the signal to the basic input symbol rate by a factor of 3/2. In another example, the input symbol rate is 1.5 times the output symbol rate. In this case, the processing rate can be twice the output symbol rate, which is 4/3 times the input symbol rate. Thus, the echo canceller interpolates the output symbols by a factor of 2, while the equalizer decimates the signals by 4/3.

Figure 3:
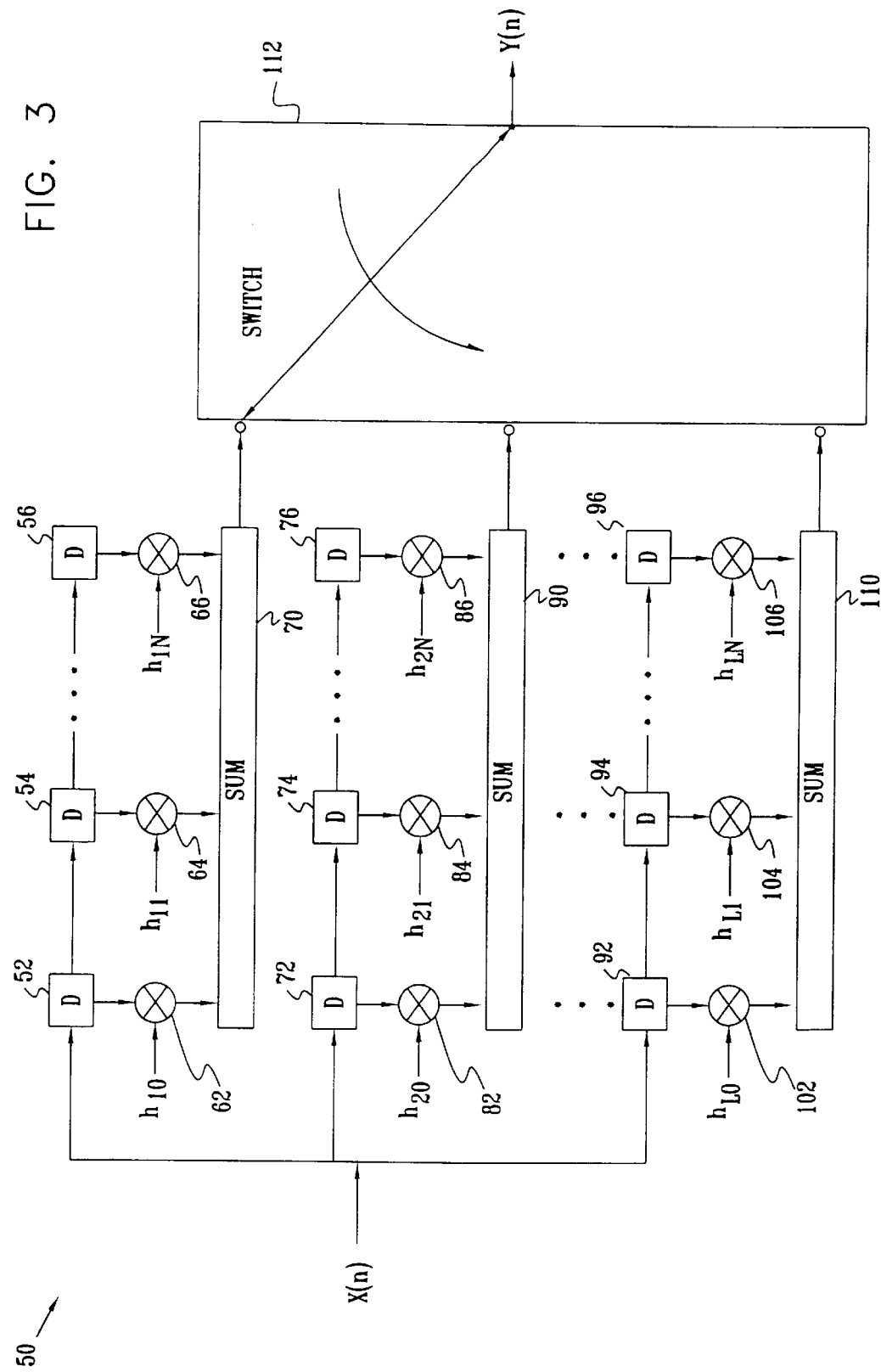
FIG. 3 is a block diagram that schematically illustrates a filter having an output sample rate that is a rational, non-integer multiple of its input sample rate, in accordance with a preferred embodiment of the present invention.
Figure 4:
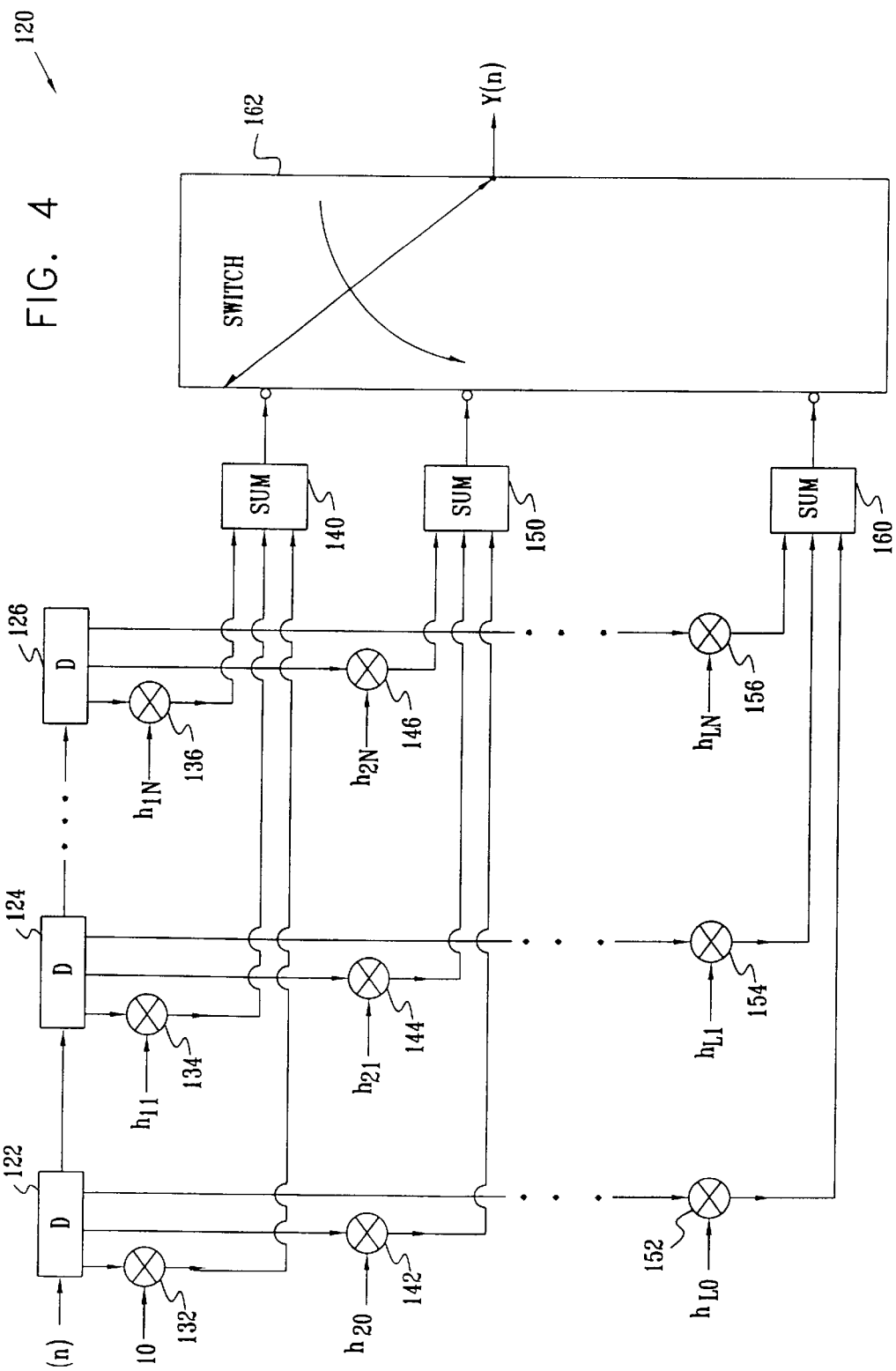
FIG. 4 is a block diagram that schematically illustrates a filter having an output sample rate that is a rational, non-integer multiple of its input sample rate, in accordance with another preferred embodiment of the present invention.
Figure 5:
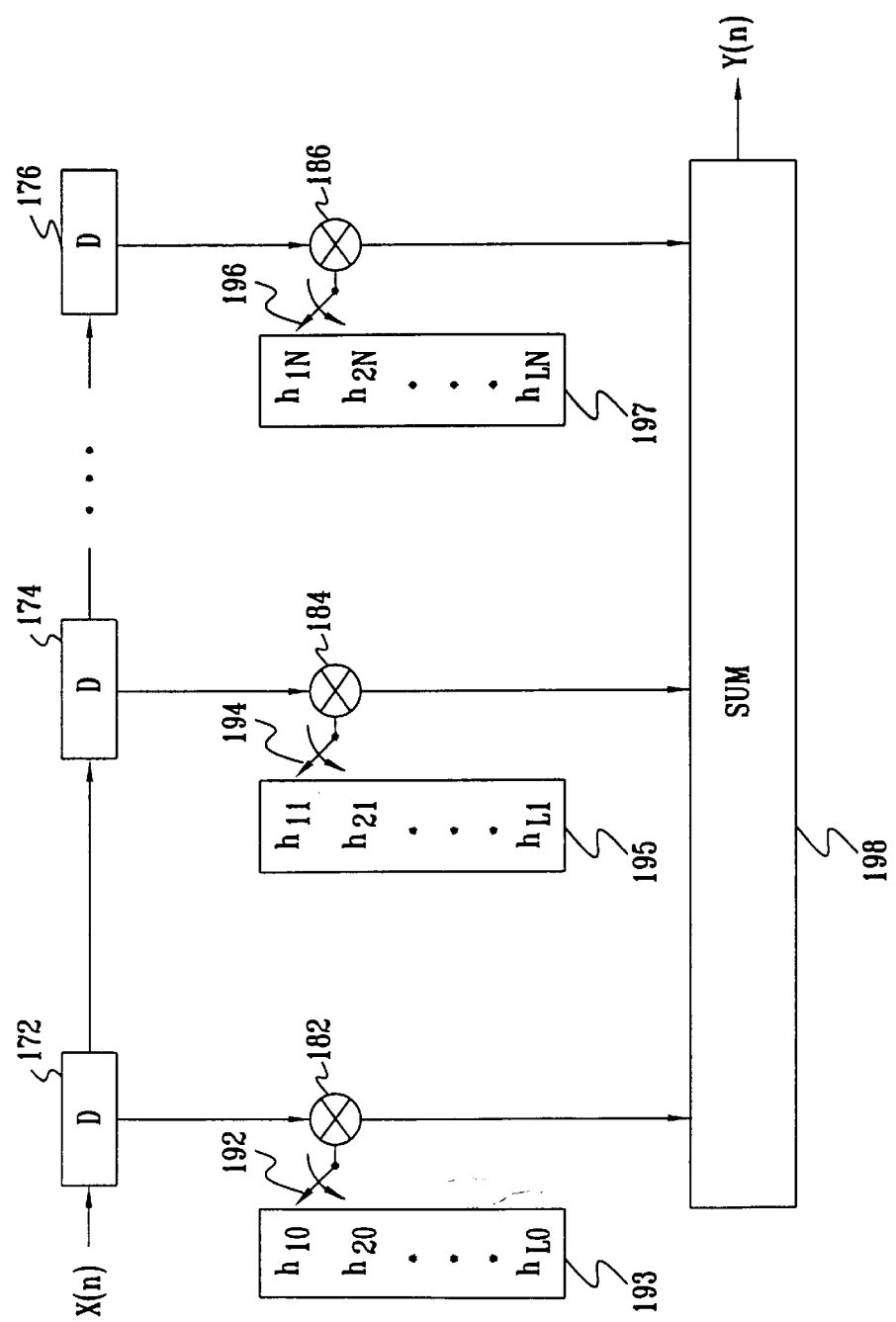
FIG. 5 is a block diagram that schematically illustrates a filter having an output sample rate that is a rational, non-integer multiple of its input sample rate, in accordance with still another preferred embodiment of the present invention.

FIG. 3 is a block diagram that schematically illustrates a filter 50 having an output sample rate that is a rational, non-integer multiple of its input sample rate, in accordance with a preferred embodiment of the present invention. Filters of this type may be used to perform the functions of echo canceller 32 and feed-forward equalizer 36. The filter combines the required filtering function, such as echo canceling or equalization, with a change in the sample rate by a factor L/M (upsampling if L>M, and downsampling if L<M) and accompanying interpolation or decimation. While the design of filter 50, shown in FIG. 3, is not the most efficient in terms of hardware implementation, it is useful in understanding the principles of these filters. FIGS. 4 and 5 show other, more efficient implementations that embody the same general principles.

An input signal x(n) is input to L parallel sequences of taps: a first group of taps 52, 54, . . . , 56; a second group 72, 74, . . . , 76; and so forth up to an Lth group 92, 94, . . . , 96. Each tap is sequentially delayed relative to its predecessor by a time equal to the input sample spacing T. Each of the taps feeds a corresponding group of multipliers 62, 64, . . . , 66; 82, 84, . . . , 86; up to 102, 104, . . . , 106. Each multiplier multiplies the value x(n) in the tap by a corresponding coefficient $h_{ij}$, which is held in a suitable register coupled to the multiplier. The products of the multipliers in each group are summed by a corresponding summer 70, 90, . . . , up to 110, to generate a partial sum. Thus, up to this point, each group of taps, multipliers and summer resembles an ordinary finite impulse response (FIR) filter. The partial sums correspond to successive samples obtained by upsampling the input signal by L, interpolating and filtering with the desired filter response.

A switch 112 selects alternately among the summers to feed an output y(n). The switch decimates the interpolated signal by a factor M, to provide output y(n) with a sample rate equal to L/M times the input sample rate of x(n). For the purposes of echo canceler 32, for example, it has been found that L=3 and M=2, which provides upsampling by 1.5, gives useful results. In this case, there are three groups of taps, multipliers and a summer, and switch 112 alternates among the summers at a rate of 2/3T. In this case, equalizer 36 will accordingly have L=2 and M=3. Other choices of L and M may be substituted in a straightforward manner.

Preferably, the operation of multipliers 62–66, 82–86 and 102–106 is synchronized with the selection of the respective summers 70, 90 and 110 by switch 112, so that the multipliers do not need to operate at the full input sample rate, but can rather work at 1/M times the input rate. Thus, filter 50 provides efficient multi-rate hardware that enables significant reduction in the number of computations per symbol interval needed compared to schemes known in the art Formally, the transfer function of filter 50 (without applying decimation, i.e. for M=1) can be expressed by the following equations, using a polyphase representation, as described, for example, in the above-mentioned book by Vaidyanathan:

$$H(z)H_1(z^L)+z^{-1}H_2(z^L)+ \ldots +z^{-(L-1)}H_L(z^L)$$

$$H_1(z)=h_{10}+h_{11}z^{-1}+ \ldots +h_{1N}z^{-N}$$

$$H_2(z)=h_{20}+h_{21}z^{-1}+ \ldots +h_{2N}z^{-N}$$

$$\ldots$$

$$H_L(z)=h_{L0}+h_{L1}z^{-1}+ \ldots +h_{LN}z^{-N}$$

Partial sums $H_1(z)$ through $H_L(z)$ represent the transfer functions of the different phases (sections) of the filter. For each group of taps, the corresponding coefficients $h_{i0}, \ldots, h_{iN}$ combine the functions of the filter as a whole (such as echo cancellation or equalization) and interpolation associated with the change in sampling rate.

FIG. 4 is a block diagram that schematically illustrates a filter 120 whose output sample rate is again a rational, non-integer multiple L/M of its input sample rate, in accordance with another preferred embodiment of the present invention. Filter 120 has the advantage over filter 50 that it uses only one set of taps 122, 124, . . . , 126, which feed L groups of multipliers 132, 134, . . . , 136; multipliers 142, 144, . . . , 146; and so forth up to multipliers 152, 154, . . . , 156. The multipliers have corresponding groups of coefficients $h_{ij}$, which are substantially the same as the coefficients used in filter 50 and described with reference thereto. The products of each group of multipliers are summed by a respective summer 140, 150, . . . , up to 160, and the summer outputs are selected by a switch 162, again substantially as described above.

As described above with reference to FIG. 3, the operation of multipliers 132 through 156 is preferably synchronized with the selection of the respective summers by switch 162, so that the multipliers do not need to operate at the full input sample rate, but can rather work at 1/M times the input rate. Filter 120 is additionally advantageous in that it reduces the number of memory registers that must be used for the filter taps.

FIG. 5 is a block diagram that schematically illustrates a filter 170, also having an output sample rate L/M times its input rate, in accordance with still another preferred embodiment of the present invention. This implementation uses only a single sequence of taps 172, 174, . . . 176 and a corresponding sequence of multipliers 182, 184, . . . , 186, feeding a single summer 198. Instead of a single switch selecting among the summed outputs of different groups of multipliers as in filters 50 and 120, however, filter 170 uses multiple switches 192, 194, . . . , 196. Each switch selects the appropriate coefficient values of $h_{i0}, h_{i1}, \ldots, h_{iN}$ to generate each output sample. The coefficient values, as given by the equations above, are stored in register arrays 193, 195, . . . , 197. In this embodiment, multipliers 182, 184, . . . , 186 must operate at the full L/M rate, but the total hardware required to implement the filter is reduced. While the total number of computations that the multipliers and summer in filter 170 must carry out for a given value of L is identical to that in filters 50 and 120, filter 170 uses a smaller number of higher-speed components for this purpose.

In filters 50, 120 and 170, the multipliers can be realized in various ways, as are known in the art, such as multiply-and-accumulate units or digital signal processor (DSP) elements.

Although filters 50, 120 and 170 comprise finite impulse response (FIR) filters, the design of these filters may be modified in a straightforward manner to produce infinite impulse response (IIR) filters, as well.

Figure 6:
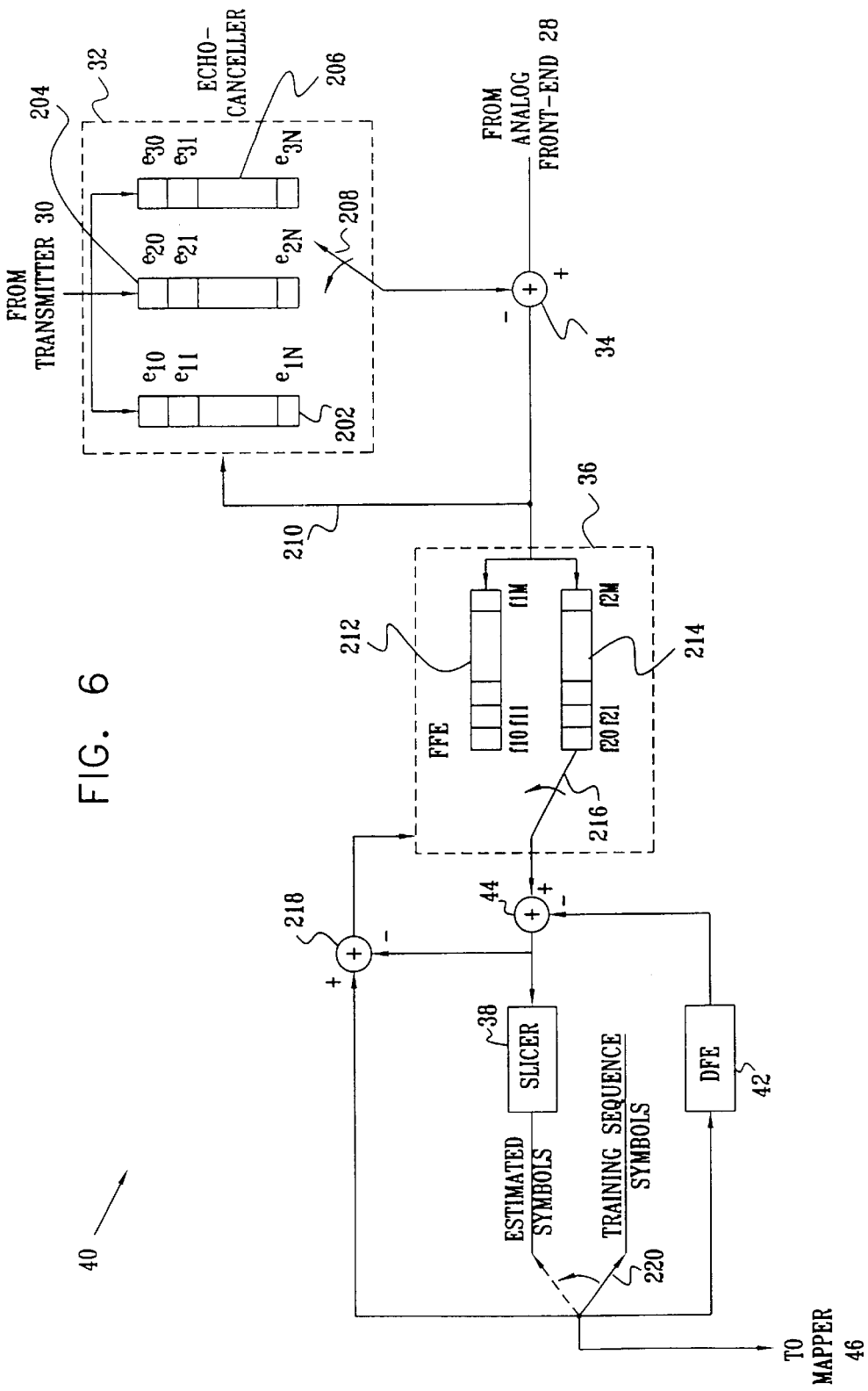
FIG. 6 is a block diagram that schematically shows details of the transceiver of FIG. 2, in accordance with a preferred embodiment of the present invention.

FIG. 6 is a block diagram that schematically illustrates details of receiver 40 (FIG. 2), in accordance with a preferred embodiment of the present invention. Echo canceller 32 is shown to comprise three filter groups 202, 204 and 206, among which a switch 208 alternately selects an output. Similar, equalizer 36 comprises two filter groups 212 and 214, with an alternating switch 216. Details of the structure of the echo canceller and equalizer may follow any of the models shown in FIGS. 3, 4 and 5, or any other model that suitably implements the principles of the present invention. Switch 208 selects among groups 202, 204 and 206 at a rate of 1.5X (wherein 1X is the basic symbol rate, as noted above), while switch 216 selects among groups 212 and 214 at a rate of 1X.

Preferably, both echo canceller 32 and equalizer 36 comprise adaptive filters, whose coefficients $h_{ij}$ may vary during operation of transceiver 20 based on an error signal derived from the output of the filter. Most preferably, the adaptation proceeds in accordance with a least-mean-square (LMS) algorithm, as described, for example, by Haykin in *Adaptive Filter Theory* (3rd edition, Prentice Hall, 1996), which is incorporated herein by reference, pages 365–372, as well as in the above-mentioned book by Gitlin et al., section 8.4. Each of the filter coefficients at time n+1 is then given by the corresponding coefficient at time n, according to the following formula:

$$h_{ij}(n+1) = h_{ij}(n) + \gamma \cdot e(n) \cdot u_j(n)$$

Here e(n) is the error signal at time n, $u_j(n)$ is the input signal at tap j at time n, and γ is an adaptation factor, which controls the rate of convergence of the coefficients. Preferably, a new filter coefficient is calculated only as often as the coefficient is used by the filter, i.e., at intervals of MT.

In the case of echo canceller 32, the error signal e(n) is provided on a feedback line 210, based on the echo-cancelled input to equalizer 36, following adder 34. In other words, e(n) corresponds to the difference between the signal received from front end 28 and the echo estimated by the echo canceller.

The error signal e(n) to feed-forward equalizer (FFE) 36 is provided by an adder 218, which takes a difference between the input to slicer 38 and the output symbols estimated by the slicer. Decision feedback equalizer (DFE) 42 preferably receives this same error signal and also operates adaptively.

Preferably, before receiver 40 begins receiving actual data from a remote transmitter, a known training sequence is transmitted to the receiver in order to determine appropriate initial values for the filter coefficients of feed-forward equalizer 36 and decision feedback equalizer 42. A switch 220 selects the training sequence symbols, for input to adder 218, in place of the estimated symbols output by the slicer. The training sequence for this purpose may be stored in a memory, or it may be generated by appropriate circuitry in transceiver 20. The use of such a training sequence is desirable in order to ensure that the filter coefficients begin at the correct values, including the interpolation effect of the coefficients. Thus, the training sequence can be used to force the coefficients in group 212 to converge on the odd symbols in the training sequence, for example, while those in group 214 converge on the even symbols. In the absence of such a training sequence or other initial constraint on the coefficients, it may occur that the coefficients in the two groups will converge on the same (odd or even) symbols.

Alternatively, other means may be used to ensure that groups 212 and 214 have the appropriate starting coefficients. For example, in an initial stage of operation of receiver 40, only group 212 may be used. Then, once the coefficients in group 212 have converged, initial coefficients for group 214 may be determined by interpolation between the coefficients in group 212, so as to account for the phase delay between the two groups. As another example, the coefficients in the two groups may be subjected to different initial conditions, chosen to ensure that they will take different convergence paths.

Although preferred embodiments are described herein with reference to a particular data transceiver 20, it will be understood that the principles of the present invention and multi-rate, adaptive filters based on these principles may similarly be used in other signal processing applications, as well. It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A digital data receiver, comprising:
   a front end, coupled to receive an input signal transmitted over a communication channel, the signal representing a stream of transmitted symbols with a given input symbol rate, and to generate, responsive to the input signal, a stream of received samples at a processing rate that is a non-integer rational multiple of the input symbol rate;
   a feed-forward equalizer, coupled to receive input samples at the processing rate, responsive to the received samples, and to generate forward-equalized samples at the input symbol rate, the feed-forward equalizer comprising:
      a first plurality of taps, arranged in series to receive a succession of the input samples at the processing rate;
      a second plurality of registers operative to store filter coefficients in a number of groups, such that each group contains one filter coefficient for each of the first plurality of taps;
      a third plurality of multipliers, coupled to multiply the samples in the taps by the corresponding filter coefficients so as to generate respective tap outputs for each one of the groups;
      one or more summers, coupled to sum the tap outputs for each one of the groups, thus generating respective group equalized partial sums; and
      at least one switch, operative to select among the groups at the input symbol rate, so that the equalized partial sums are output in alternation as the forward-equalized samples; and
   decision circuitry, coupled to process the forward-equalized samples so as to generate a stream of estimated symbols at the input symbol rate.

2. A receiver according to claim 1, wherein the input signal comprises a Digital Subscriber Line (DSL) signal.

3. A receiver according to claim 1, wherein the feed-forward equalizer comprises an adaptive filter, and wherein the filter coefficients are adjusted automatically responsive to an error signal based on the stream of estimated symbols.

4. A digital data receiver, comprising:
   a front end, coupled to receive an input signal transmitted over a communication channel, the signal representing a stream of transmitted symbols with a given input symbol rate, and to generate, responsive to the input signal, a stream of received samples at a processing rate that is a non-integer rational multiple of the input symbol rate;

a feed-forward equalizer, coupled to receive input samples at the processing rate, responsive to the received samples, and to generate forward-equalized samples at the input symbol rate, the feed-forward equalizer comprising:

a first plurality of taps, arranged in series to receive a succession of the input samples at the processing rate;

a second plurality of registers operative to store filter coefficients in a number of groups, such that each group contains one filter coefficient for each of the first plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group equalized partial sums; and at least one switch, operative to select among the groups at the input symbol rate, so that the equalized partial sums are output in alternation as the forward-equalized samples; and decision circuitry, coupled to process the forward-equalized samples so as to generate a stream of estimated symbols at the input symbol rate, wherein the processing rate is substantially equal to 1.5 times the input symbol rate.

5. A digital data receiver, comprising:

a front end, coupled to receive an input signal transmitted over a communication channel, the signal representing a stream of transmitted symbols with a given input symbol rate, and to generate, responsive to the input signal, a stream of received samples at a processing rate that is a non-integer rational multiple of the input symbol rate;

a feed-forward equalizer, coupled to receive input samples at the processing rate, responsive to the received samples, and to generate forward-equalized samples at the input symbol rate, the feed-forward equalizer comprising:

a first plurality of taps, arranged in series to receive a succession of the input samples at the processing rate;

a second plurality of registers operative to store filter coefficients in a number of groups, such that each group contains one filter coefficient for each of the first plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group equalized partial sums; and at least one switch, operative to select among the groups at the input symbol rate, so that the equalized partial sums are output in alternation as the forward-equalized samples;

decision circuitry, coupled to process the forward-equalized samples so as to generate a stream of estimated symbols at the input symbol rate; and a training switch, coupled to substitute a sequence of known training symbols for the estimated symbols during an initial adjustment of the filter coefficients of the equalizer.

6. A digital data receiver, wherein the receiver is coupled to a transmitter, which is adapted to transmit an output signal over the channel based on a stream of output symbols, and wherein the receiver comprises:

a front end, coupled to receive an input signal transmitted over a communication channel, the signal representing a stream of transmitted symbols with a given input symbol rate, and to generate, responsive to the input signal, a stream of received samples at a processing rate that is a non-integer rational multiple of the input symbol rate;

a feed-forward equalizer, coupled to receive input samples at the processing rate, responsive to the received samples, and to generate forward-equalized samples at the input symbol rate, the feed-forward equalizer comprising:

a first plurality of taps, arranged in series to receive a succession of the input samples at the processing rate;

a second plurality of registers operative to store filter coefficients in a number of groups, such that each group contains one filter coefficient for each of the first plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group equalized partial sums; and at least one switch, operative to select among the groups at the input symbol rate, so that the equalized partial sums are output in alternation as the forward-equalized samples;

decision circuitry, coupled to process the forward-equalized samples so as to generate a stream of estimated symbols at the input symbol rate;

an echo canceller, coupled to generate, responsive to the output symbols, echo cancellation values at the processing rate; and an adder, coupled to sum the received samples with the echo cancellation values, thus generating the input samples to the feed-forward equalizer at the processing rate.

7. A digital data transceiver, comprising:

a transmitter, which is adapted to transmit an output signal over a communication channel based on a stream of output symbols at an output symbol rate;

an echo canceller, coupled to generate, responsive to the output symbols, echo cancellation values at a predetermined processing rate; and a receiver, which comprises:

a front end, coupled to receive an input signal over the communication channel, the signal representing a stream of transmitted symbols with a given input symbol rate, and to generate, responsive thereto, a stream of input samples at the processing rate;

an adder, coupled to sum the input samples with the echo cancellation values, thus generating echo-canceled samples at the processing rate;

an equalizer, coupled to filter the echo-canceled samples so as to generate equalized samples at the input symbol rate; and decision circuitry, coupled to process the equalized samples so as to generate a stream of estimated symbols at the input symbol rate, wherein the processing rate is a non-integer rational multiple of at least one of the input symbol rate and the output symbol rate.

8. A transceiver according to claim 7, wherein the input and output signals comprise Digital Subscriber Line (DSL) signals.

9. A transceiver according to claim 7, wherein the equalizer comprises:
   a first plurality of taps, arranged in series to receive a succession of the echo-canceled samples at the processing rate;
   a second plurality of registers operative to store a first number of groups of filter coefficients, such that each group contains one filter coefficient for each of the first plurality of taps;
   a third plurality of multipliers, coupled to multiply the samples in the taps by the corresponding filter coefficients so as to generate respective tap outputs for each one of the groups;
   one or more summers, coupled to sum the tap outputs for each one of the groups, thus generating respective group equalized partial sums; and
   at least one switch, operative to select among the groups at the input symbol rate so that the partial sums are output in alternation as the equalized samples at the input symbol rate.

10. A transceiver according to claim 7, wherein the output symbol rate is substantially equal to the input symbol rate.

11. A transceiver according to claim 7, wherein the equalizer comprises an adaptive filter, having filter coefficients that are adjusted automatically responsive to an error signal based on the estimated symbols.

12. A digital data transceiver, comprising:
   a transmitter, which is adapted to transmit an output signal over a communication channel based on a stream of output symbols at an output symbol rate;
   an echo canceller, coupled to generate, responsive to the output symbols, echo cancellation values at a predetermined processing rate; and
   a receiver, which comprises:
      a front end, coupled to receive an input signal over the communication channel, the signal representing a stream of transmitted symbols with a given input symbol rate, and to generate, responsive thereto, a stream of input samples at the processing rate;
      an adder, coupled to sum the input samples with the echo cancellation values, thus generating echo-canceled samples at the processing rate;
      an equalizer, coupled to filter the echo-canceled samples so as to generate equalized samples at the input symbol rate; and
      decision circuitry, coupled to process the equalized samples so as to generate a stream of estimated symbols at the input symbol rate,
   wherein the processing rate is a non-integer rational multiple of at least one of the input symbol rate and the output symbol rate, and
   wherein the processing rate is substantially equal to 1.5 times the input symbol rate.

13. A digital data transceiver, comprising:
   a transmitter, which is adapted to transmit an output signal over a communication channel based on a stream of output symbols at an output symbol rate;
   an echo canceller, coupled to generate, responsive to the output symbols, echo cancellation values at a predetermined processing rate; and
   a receiver, which comprises:
      a front end, coupled to receive an input signal over the communication channel, the signal representing a stream of transmitted symbols with a given input symbol rate, and to generate, responsive thereto, a stream of input samples at the processing rate;
      an adder, coupled to sum the input samples with the echo cancellation values, thus generating echo-canceled samples at the processing rate;
      an equalizer, coupled to filter the echo-canceled samples so as to generate equalized samples at the input symbol rate; and
      decision circuitry, coupled to process the equalized samples so as to generate a stream of estimated symbols at the input symbol rate,
   wherein the processing rate is a non-integer rational multiple of at least one of the input symbol rate and the output symbol rate,
   wherein the echo canceller comprises:
      a first plurality of taps, arranged in series to receive a succession of the output symbols at the output symbol rate;
      a second plurality of registers operative to store a first number of groups of filter coefficients, such that each group contains one filter coefficient for each of the first plurality of taps;
      a third plurality of multipliers, coupled to multiply the samples in the taps by the corresponding filter coefficients so as to generate respective tap outputs for each one of the groups;
      one or more summers, coupled to sum the tap outputs for each one of the groups, thus generating respective group echo cancellation partial sums; and
      at least one switch, operative to select among the groups at the processing rate so that the partial sums are output in alternation as the echo cancellation values at the processing rate.

14. A digital data transceiver, comprising:
   a transmitter, which is adapted to transmit an output signal over a communication channel based on a stream of output symbols at an output symbol rate;
   an echo canceller, coupled to generate, responsive to the output symbols, echo cancellation values at a predetermined processing rate; and
   a receiver, which comprises:
      a front end, coupled to receive an input signal over the communication channel, the signal representing a stream of transmitted symbols with a given input symbol rate, and to generate, responsive thereto, a stream of input samples at the processing rate;
      an adder, coupled to sum the input samples with the echo cancellation values, thus generating echo-canceled samples at the processing rate;
      an equalizer, coupled to filter the echo-canceled samples so as to generate equalized samples at the input symbol rate; and
      decision circuitry, coupled to process the equalized samples so as to generate a stream of estimated symbols at the input symbol rate,
   wherein the processing rate is a non-integer rational multiple of at least one of the input symbol rate and the output symbol rate, and
   wherein the output symbol rate is different from the input symbol rate.

15. A digital data transceiver, comprising:
   a transmitter, which is adapted to transmit an output signal over a communication channel based on a stream of output symbols at an output symbol rate;

an echo canceller, coupled to generate, responsive to the output symbols, echo cancellation values at a predetermined processing rate; and a receiver, which comprises:
a front end, coupled to receive an input signal over the communication channel, the signal representing a stream of transmitted symbols with a given input symbol rate, and to generate, responsive thereto, a stream of input samples at the processing rate;

an adder, coupled to sum the input samples with the echo cancellation values, thus generating echo-canceled samples at the processing rate;

an equalizer, coupled to filter the echo-canceled samples so as to generate equalized samples at the input symbol rate; and decision circuitry, coupled to process the equalized samples so as to generate a stream of estimated symbols at the input symbol rate, wherein the processing rate is a non-integer rational multiple of at least one of the input symbol rate and the output symbol rate, and wherein the echo canceller comprises an adaptive filter, having filter coefficients that are adjusted automatically responsive to an error signal based on the input samples.

16. A method for processing an input signal received over a communication channel, in the presence of an echo signal based on a stream of output symbols provided at an output symbol rate, the input signal representing a stream of transmitted symbols with a given input symbol rate, the method comprising:

determining echo cancellation values at a predetermined processing rate, responsive to the stream of output symbols;

sampling the input signal to generate a stream of received samples at the processing rate;

summing the received samples with the echo cancellation values, thus generating echo-canceled samples at the processing rate;

equalizing the echo-canceled samples so as to generate a stream of forward-equalized samples at the input symbol rate; and applying a decision process to the forward-equalized samples so as to generate a stream of estimated symbols at the input symbol rate, wherein the processing rate is a non-integer rational multiple of at least one of the input symbol rate and the output symbol rate.

17. A method according to 16, wherein the input signal comprises a Digital Subscriber Line (DSL) signal.

18. A method according to claim 16, wherein processing the received samples comprises equalizing the received samples adaptively, using filter coefficients that are adjusted automatically responsive to an error signal derived from the estimated symbols.

19. A method according to claim 16, wherein the output symbol rate is substantially equal to the input symbol rate.

20. A method for processing an input signal received over a communication channel, in the presence of an echo signal based on a stream of output symbols provided at an output symbol rate, the input signal representing a stream of transmitted symbols with a given input symbol rate, the method comprising:

determining echo cancellation values at a predetermined processing rate, responsive to the stream of output symbols;

sampling the input signal to generate a stream of received samples at the processing rate;

summing the received samples with the echo cancellation values, thus generating echo-canceled samples at the processing rate;

equalizing the echo-canceled samples so as to generate a stream of forward-equalized samples at the input symbol rate; and applying a decision process to the forward-equalized samples so as to generate a stream of estimated symbols at the input symbol rate, wherein the processing rate is a non-integer rational multiple of at least one of the input symbol rate and the output symbol rate, and wherein the processing rate is substantially equal to 1.5 times the input symbol rate.

21. A method for processing an input signal received over a communication channel, in the presence of an echo signal based on a stream of output symbols provided at an output symbol rate, the input signal representing a stream of transmitted symbols with a given input symbol rate, the method comprising:

determining echo cancellation values at a predetermined processing rate, responsive to the stream of output symbols;

sampling the input signal to generate a stream of received samples at the processing rate;

summing the received samples with the echo cancellation values, thus generating echo-canceled samples at the processing rate;

equalizing the echo-canceled samples so as to generate a stream of forward-equalized samples at the input symbol rate; and applying a decision process to the forward-equalized samples so as to generate a stream of estimated symbols at the input symbol rate, wherein the processing rate is a non-integer rational multiple of at least one of the input symbol rate and the output symbol rate, and wherein processing the received samples comprises equalizing the received samples adaptively, using filter coefficients that are adjusted automatically responsive to an error signal derived from the estimated symbols, and wherein equalizing the received samples adaptively comprises substituting a sequence of known training symbols for the estimated symbols during an initial adjustment of the filter coefficients.

22. A method for processing an input signal received over a communication channel, in the presence of an echo signal based on a stream of output symbols provided at an output symbol rate, the input signal representing a stream of transmitted symbols with a given input symbol rate, the method comprising:

determining echo cancellation values at a predetermined processing rate, responsive to the stream of output symbols;

sampling the input signal to generate a stream of received samples at the processing rate;

summing the received samples with the echo cancellation values, thus generating echo-canceled samples at the processing rate;

equalizing the echo-canceled samples so as to generate a stream of forward-equalized samples at the input symbol rate; and applying a decision process to the forward-equalized samples so as to generate a stream of estimated symbols at the input symbol rate, wherein the processing rate is a non-integer rational multiple of at least one of the input symbol rate and the output symbol rate, and wherein processing the received samples comprises equalizing the received samples adaptively, using filter coefficients that are adjusted automatically responsive to an error signal derived from the estimated symbols, and wherein equalizing the received samples adaptively comprises:

providing at least first and second groups of filter coefficients for use in equalizing the received samples; initially determining values of the filter coefficients in the first group; and subsequently determining values of the filter coefficients in the second group responsive to the values determined in the first group.

23. A method for processing an input signal received over a communication channel, in the presence of an echo signal based on a stream of output symbols provided at an output symbol rate, the input signal representing a stream of transmitted symbols with a given input symbol rate, the method comprising:

determining echo cancellation values at a predetermined processing rate, responsive to the stream of output symbols;

sampling the input signal to generate a stream of received samples at the processing rate;

summing the received samples with the echo cancellation values, thus generating echo-canceled samples at the processing rate;

equalizing the echo-canceled samples so as to generate a stream of forward-equalized samples at the input symbol rate; and applying a decision process to the forward-equalized samples so as to generate a stream of estimated symbols at the input symbol rate, wherein the processing rate is a non-integer rational multiple of at least one of the input symbol rate and the output symbol rate, and wherein determining the echo cancellation values comprises determining the values adaptively, using filter coefficients that are adjusted automatically responsive to the echo-canceled samples.

24. A method for processing an input signal received over a communication channel, in the presence of an echo signal based on a stream of output symbols provided at an output symbol rate, the input signal representing a stream of transmitted symbols with a given input symbol rate, the method comprising:

determining echo cancellation values at a predetermined processing rate, responsive to the stream of output symbols;

sampling the input signal to generate a stream of received samples at the processing rate;

summing the received samples with the echo cancellation values, thus generating echo-canceled samples at the processing rate;

equalizing the echo-canceled samples so as to generate a stream of forward-equalized samples at the input symbol rate; and applying a decision process to the forward-equalized samples so as to generate a stream of estimated symbols at the input symbol rate, wherein the processing rate is a non-integer rational multiple of at least one of the input symbol rate and the output symbol rate, and wherein the output symbol rate is different from the input symbol rate.

25. An adaptive digital filter for processing an input signal having an input sample rate, comprising:

a first plurality of taps, arranged in series to receive a succession of samples of the input signal at the input sample rate;

a second plurality of registers operative to store a number of groups of filter coefficients, which are automatically adjustable during operation of the filter, such that each group contains one filter coefficient for each of the plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group partial sums; and at least one switch, operative to select among the groups at a selection rate that is substantially equal to the product of the input sample rate times the number of groups divided by a selected integer, so as to generate an output signal comprising a sequence of the partial sums having an output sample rate that is a non-integer rational fraction of the input sample rate; and an error signal input line, coupled to provide to the filter an error signal derived from the output signal for use in automatic adjustment of the filter coefficients.

26. A filter according to claim 25, wherein the third plurality of multipliers comprises a number of multipliers for each of the taps that is equal to the number of groups, such that one of the multipliers is assigned respectively to generate each of the tap outputs.

27. A filter according to claim 25, wherein the one or more summers comprise a single summer.

28. A filter according to claim 27, wherein the at least one switch comprises a respective switch for each of the first plurality of taps, which switch is coupled to select the filter coefficient by which to multiply the sample in the tap.

29. A filter according to claim 25, wherein the number of groups is chosen to be one of the values two and three, and wherein the selected integer is equal to the other of the values.

30. A filter according to claim 25, wherein the filter comprises a feed-forward equalizer, and the output signal comprises equalized signal values, and wherein the error signal is responsive to a difference between the equalized signal values and estimated symbols derived from the equalized signal values.

31. An adaptive digital filter for processing an input signal having an input sample rate, comprising:

a first plurality of taps, arranged in series to receive a succession of samples of the input signal at the input sample rate;

a second plurality of registers operative to store a number of groups of filter coefficients, which are automatically adjustable during operation of the filter, such that each group contains one filter coefficient for each of the plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group partial sums; and at least one switch, operative to select among the groups at a selection rate that is substantially equal to the product of the input sample rate times the number of groups divided by a selected integer, so as to generate an output signal comprising a sequence of the partial sums having an output sample rate that is a non-integer rational fraction of the input sample rate; and an error signal input line, coupled to provide to the filter an error signal derived from the output signal for use in automatic adjustment of the filter coefficients, wherein the one or more summers comprise a respective summer for each of the groups, and the at least one switch is operative to select among the respective group partial sums.

32. An adaptive digital filter for processing an input signal having an input sample rate, comprising:

a first plurality of taps, arranged in series to receive a succession of samples of the input signal at the input sample rate;

a second plurality of registers operative to store a number of groups of filter coefficients, which are automatically adjustable during operation of the filter, such that each group contains one filter coefficient for each of the plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group partial sums; and at least one switch, operative to select among the groups at a selection rate that is substantially equal to the product of the input sample rate times the number of groups divided by a selected integer, so as to generate an output signal comprising a sequence of the partial sums having an output sample rate that is a non-integer rational fraction of the input sample rate; and an error signal input line, coupled to provide to the filter an error signal derived from the output signal for use in automatic adjustment of the filter coefficients, wherein the third plurality of multipliers comprises a number of multipliers for each of the taps that is equal to the number of groups, such that one of the multipliers is assigned respectively to generate each of the tap outputs, and wherein the multipliers operate at a rate that is substantially equal to the input sample rate divided by the selected integer.

33. An adaptive digital filter for processing an input signal having an input sample rate, comprising:

a first plurality of taps, arranged in series to receive a succession of samples of the input signal at the input sample rate;

a second plurality of registers operative to store a number of groups of filter coefficients, which are automatically adjustable during operation of the filter, such that each group contains one filter coefficient for each of the plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group partial sums; and at least one switch, operative to select among the groups at a selection rate that is substantially equal to the product of the input sample rate times the number of groups divided by a selected integer, so as to generate an output signal comprising a sequence of the partial sums having an output sample rate that is a non-integer rational fraction of the input sample rate; and an error signal input line, coupled to provide to the filter an error signal derived from the output signal for use in automatic adjustment of the filter coefficients, wherein each filter coefficient is automatically adjusted at an adjustment rate that is substantially equal to the input sample rate divided by the selected integer.

34. An adaptive digital filter for processing an input signal having an input sample rate, comprising:

a first plurality of taps, arranged in series to receive a succession of samples of the input signal at the input sample rate;

a second plurality of registers operative to store a number of groups of filter coefficients, which are automatically adjustable during operation of the filter, such that each group contains one filter coefficient for each of the plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group partial sums; and at least one switch, operative to select among the groups at a selection rate that is substantially equal to the product of the input sample rate times the number of groups divided by a selected integer, so as to generate an output signal comprising a sequence of the partial sums having an output sample rate that is a non-integer rational fraction of the input sample rate; and an error signal input line, coupled to provide to the filter an error signal derived from the output signal for use in automatic adjustment of the filter coefficients, wherein the filter coefficients are automatically adjusted using a least-mean-square method.

35. An adaptive digital filter for processing an input signal having an input sample rate, comprising:

a first plurality of taps, arranged in series to receive a succession of samples of the input signal at the input sample rate;

a second plurality of registers operative to store a number of groups of filter coefficients, which are automatically adjustable during operation of the filter, such that each group contains one filter coefficient for each of the plurality of taps;

a third plurality of multipliers, coupled to multiply the samples in the taps by the corresponding filter coefficients so as to generate respective tap outputs for each one of the groups;

one or more summers, coupled to sum the tap outputs for each one of the groups, thus generating respective group partial sums; and at least one switch, operative to select among the groups at a selection rate-that is substantially equal to the product of the input sample rate times the number of groups divided by a selected integer, so as to generate an output signal comprising a sequence of the partial sums having an output sample rate that is a non-integer rational fraction of the input sample rate;

an error signal input line, coupled to provide to the filter an error signal derived from the output signal for use in automatic adjustment of the filter coefficients; and an echo cancellation filter, wherein the output signal comprises echo estimation values, and wherein the error signal provides an estimate of a residual echo remaining following subtraction of the echo estimation values from a received signal.

36. A method for adaptive digital filtering of an input signal having an input sample rate, comprising:

receiving a plurality of successive samples of the input signal at the input sample rate;

automatically computing a number of groups of filter coefficients responsive to an error signal, each group containing one filter coefficient for each of the plurality of samples;

multiplying the samples by the corresponding filter coefficients so as to generate for each of the samples respective sample outputs for all of the groups;

summing the sample outputs belonging to each one of the groups, thus generating respective group partial sums for all of the groups;

selecting among the groups at a selection rate that is substantially equal to the product of the input sample rate times the number of groups divided by a selected integer, so as to generate an output signal comprising a sequence of the partial sums having an output sample rate that is a non-integer rational fraction of the input sample rate; and deriving the error signal from the output signal.

37. A method according to claim 36, wherein the number of groups is chosen to be one of the values two and three, and wherein the selected integer is equal to the other of the values.

38. A method for adaptive digital filtering of an input signal having an input sample rate, comprising:

receiving a plurality of successive samples of the input signal at the input sample rate;

automatically computing a number of groups of filter coefficients responsive to an error signal, each group containing one filter coefficient for each of the plurality of samples;

multiplying the samples by the corresponding filter coefficients so as to generate for each of the samples respective sample outputs for all of the groups;

summing the sample outputs belonging to each one of the groups, thus generating respective group partial sums for all of the groups;

selecting among the groups at a selection rate that is substantially equal to the product of the input sample rate times the number of groups divided by a selected integer, so as to generate an output signal comprising a sequence of the partial sums having an output sample rate that is a non-integer rational fraction of the input sample rate; and deriving the error signal from the output signal, wherein automatically adjusting the filter coefficients comprises adjusting the filter coefficients using a least-mean-square method.

* * * * *